United States Patent [19]

Yarbrough

[11] Patent Number: 5,525,819

[45] Date of Patent: Jun. 11, 1996

[54] MICROWAVE CONCENTRIC MESFET WITH INHERENT ELECTROMAGNETIC SHIELDING

[75] Inventor: Allyson D. Yarbrough, Hermosa Beach, Calif.

[73] Assignee: The Aerospace Corporation, El Segundo, Calif.

[21] Appl. No.: 271,403

[22] Filed: Jul. 6, 1994

[51] Int. Cl.$^6$ .................................................... H01L 29/80
[52] U.S. Cl. ........................... 257/275; 257/259; 257/280; 257/773
[58] Field of Search .................................. 257/275, 276, 257/277, 259, 280, 401, 270, 282, 287, 343, 409, 773

[56] References Cited

U.S. PATENT DOCUMENTS 5,313,083  5/1994  Schindler ................................. 257/280

FOREIGN PATENT DOCUMENTS

| 1183281 | 2/1985 | Canada ................................. 257/401 |
| 0330142 | 8/1989 | European Pat. Off. ................ 257/275 |
| 2-130934 | 5/1990 | Japan ..................................... 257/280 |
| 2-283071 | 5/1990 | Japan ..................................... 257/401 |

OTHER PUBLICATIONS

Beneking et al., "Gigahertz P–Channel Enhancement Silicon MOSFET With Nonoverlapping Gate," IEEE Journal of Solid–State Circuits, vol. SC–5, No. 6, Dec. 1970, pp. 328–330.

Workshop J. GaAs MMIC System Insertion and Multifunction Chip Design Issues and Trends, 1991 IEEE MTT–S International Microwave Symposium, Boston, MA Jun. 14, 1991.

M. Le Brun, P. R. Jan, C. Rumelhard, "Strip Cuts Coupling on Crowded MMIC Chips" Microwaved, 79–80 (Oct. 1981).

W. Heinrich and H. Hartnagel, "Wave Propagation on MESFET Electrodes and its Influence on Transistor Gain" IEEE Trans. Microwave Theory Tech., vol. MTT–35, No. 1, 1–8 (Jan. 1987).

W. Heinrich, "Distributed Equivalant–Circuit Model for Traveling–Wave FET Design" IEEE Trans. Microwave Theory Tech., vol. MTT–35, No. 5, 487–491 (May 1987).

N. Sebati, P. Gamand, C. Varin, F. Pasqualini, J. C. Meunier, "Continuous Active T–Gate Traveling–Wave Transistor" Electronics Letters, vol. 25, No. 6, (Mar. 1989).

G. D'Inzeo, R. Guisto, C. Petrachi, "Active Devices for Microwave Distributed Amplification" Microwave and Optical Technology Letters, vol. 3, No. 2, 51–54 (Feb. 1990).

S. D. D'Agostino, G. D'Inzeo, L. Tudini, "Analytical Modeling and Design Criteria for Traveling–Wave FET Amplifiers." IEEE Trans. Microwave Theory Tech., vol. MTT–40, No. 2, 202–208 (Feb. 1992).

M. Le Brun, P. R. Jay, C. Rumelhard, "Coupling and Impedance Between Line and Ground Electrodes on GaAs: Implications for MMIC Design" Proc. 11th European Microwave Conference, Amsterdam, 850–855 (Sep. 1981).

(List continued on next page.)

Primary Examiner—Sara W. Crane
Assistant Examiner—Courtney A. Bowers
Attorney, Agent, or Firm—William J. Burke; Derrick M. Reid

[57] ABSTRACT

A Concentric MESFET (CMESFET) is a small-signal traveling-wave transistor having a grounded source electrode which concentrically surrounds and shields the gate and drain electrodes from electromagnetic fields generated by other nearby circuit elements. S-parameters for the transistor are computed to obtain gain curves for design configurations. For a gate length of 2 um, maximum gain occurs with a gate width of 3.0 mm. The CMESFET has calculated bandwidth of 17 GHz for a 2 um gate length and a gate width of 300 m. Coupling capacitance between device electrodes and a nearby transmission line are calculated and used to verify improved source electrode shielding isolation of the device from interference and crosstalk originating in surrounding circuits.

6 Claims, 12 Drawing Sheets

OTHER PUBLICATIONS

S. Maas, Microwave Mixers, Artech House, Norwood, Mass., 1986.

S. Seki, H. Hasegawa, "Cross-tie Show-Wave Coplanar Waveguide On Semi-insulating GaAs Substrates" Electon. Lett., vol. 17, No. 25, Dec. 1981.

Y. Fukuoka, T. Itoh, "Slow-wave Coplanar Waveguide On Periodically Doped Semiconductor Substrate", IEEE Trans. Microwave Theory Tech., vol. MTT-31 pp. 1013-1017, Dec. 1983.

MICROWAVE CONCENTRIC MESFET WITH INHERENT ELECTROMAGNETIC SHIELDING

STATEMENT OF GOVERNMENT INTEREST

The invention was made with Government support under Contract No. FO4701-88-C-0089 awarded by the Department of the Air Force. The Government has certain rights in the invention.

FIELD OF THE INVENTION

The invention relates generally to semiconductor devices and more particularly to metal semiconductor field effect transistor (MESFET) structures providing enhanced inherent electromagnetic shielding.

BACKGROUND OF THE INVENTION

Modern communications demand high density, multifunction monolithic microwave integrated circuits (MMICs). MMiCs use microstrip and coplanar waveguide as the planar connections between semiconductor devices. These open waveguides contain a significant portion of electromagnetic energy above the circuit substrate. As advanced circuits are made more complex and more compact, interelement coupling begins to affect overall circuit performance. For example, if a microstrip were placed too close to a microstrip spiral inductor that is used in a filter, the parasitic coupling between the two elements could change the value of the inductor and detune the filter. Although MMIC density is still low relative to that of most advanced digital integrated circuits, MMIC designers are faced with competing objectives. A circuit design must simultaneously accommodate the area required by the largest structures such as inductors or inductive lines in an MMIC, maintain a reasonable distance from nearby transmission lines and other elements, and minimize the use of chip real estate.

A grounded transmission line has been shown to substantially decouple closely spaced transmission lines reducing the level of crosstalk by as much as 10 dB as disclosed by iM. Le Brun, P. R. Jay, and C. Rumelhard, Strip Cuts Coupling on Crowded MMiC Chips, Microwaves, 79–80, October 1981. This article does not discuss active device performance, but only transmission line performance, and therefore does not teach or address transistor source electrode configurations.

The MESFET can be modeled to predict performance characteristics. The MESFET has been modeled as a distributed device and an analytical technique has used to model traveling waves.

Calculated results, using resistive terminations, produced gain curves. Using resistive terminations, gain curves can be produced as found by W. Heinrich and H. Hartnagel, Wave, Propagation on MESFET Electrodes and Its Influence on Transistor Gain, IEEE Trans. Microwave Theory Tech., Vol. MTT-35, No. 1, 1–8, January 1987. This article does not discuss ways of configuring a transistor to enhance its shielding properties and therefore does not teach or address transistor source topologies.

A [Z] matrix for two transmission lines has been calculated. Modeling current and voltage eigenvectors have been combined to produce impedance matrix $[Z_{imp}]$, where $V_p = [Z_{imp}] Ip$. $V_p$ and $I_p$ are voltages and currents at ports of a MESFET gain section. W. Heinrich, Distributed Equivalent-Circuit Model for Traveling-Wave FET Design, IEEE Trans. Microwave Theory Tech., Vol. MTT-35, No. 5, 487–491, May 1987. This work describes MESFET models that were developed by an electromagnetic wave propagation analysis. This article does not discuss ways of configuring a transistor to enhance its shielding properties and therefore does not teach or address transistor source topologies.

A "T" cross-section configuration for a gate electrode results in reduced resistance and provides greater operating bandwidth. Growing waves have been calculated. N. Sebati, P. Gamand, C. Varin, F. Pasqualini, and J. C. Meunier, Continuous Active T-Gate Travelling-Wave Transistor, Electronics Letters, Vol. 25, No. 6, March 1989. This work uses the traveling wave analysis for high frequency MESFETs. This article does not discuss ways of configuring a transistor to enhance its shielding properties and therefore does not teach or address transistor source topologies.

"T" gate structures have been disclosed elsewhere. S. D. D'Agostino, G. D'Inzeo, and L. Tudini, Analytical Modeling and Design Criteria for Traveling-Wave FET Amplifiers, IEEE Trans. Microwave Theory Tech., Vol. MTT-40, No. 2, 202–208, February 1992. This work discloses a drain to source separation of 140 µm and a drain width of 300 µm, and uses another description of the theoretical model and design of a traveling wave MESFET. This work does not discuss ways of configuring a transistor to enhance its shielding properties and therefore does not teach or address transistor source topologies.

"T" gate dimensions have been used to evaluate microwave coupling of conductors on GaAs substrates. M. Le Brun, P. R. Jay, and C. Rumelhard, Coupling and Impedance Between Line and Ground Electrodes on GaAs: Implications for MMIC Design, Proc. 11th European Microwave Conference, Amsterdam, 850–855, September 1981. This article does not discuss active device performance and therefore does not teach or address transistor source configuration.

"T" gate dimensions have been used elsewhere. G. D'Inzeo, R. Guisto, and C. Petrachi, Active Devices for Microwave Distributed Amplification, Microwave and Optical Technology Letters, Vol. 3, No. 2, 51–54, February 1990. This work discusses a drain to source separation of 210 µm and a drain width of 500 µm which were required to produce growing waves which may not be suitable for producing a compact transistor for MMIC applications.

A dual gate FET as been described as a major advantage over single gate FET. Such devices can be used as microwave mixers as described in S. Maas, Microwave Mixers, Artech House, Norwood, Mass., 1986. This work does not discuss way of configuring a mixer FET to enhance its shielding properties and therefore does not teach or address transistor source topologies.

Coplanar waveguides on semi-insulating GaAs substrates have been disclosed with reduced size and low wave attenuation. Seki and H. Hasegawa, Cross-tie slow-wave coplanar waveguide on semi-insulating GaAs substrates, Electon. Lett., vol. 17, no. 25, pp. 940–941, December 1981. This work does not discuss active device performance and therefore does not teach or address transistor source configurations.

Coplanar structures situated atop semiconductor substrates have been described and have wide application to coplanar monolithic microwave integrated circuits. Y. Fukuoka, and T. Itoh, Slow-wave coplanar waveguide on periodically doped semiconductor substrate, IEEE Trans. Microwave Theory Tech., vol. MTT-31, pp. 1013–1017, December 1983. Y. Fukuoka and T. Itoh, Design consideration of uniform and periodic coplanar Schottky variable phase shifter, Proc. 13th Eur. Microwave Conf., pp. 278–282, September 1983. These references do not discuss active device performance and therefore do not teach or address transistor source configurations.

MESFET device modeling has been used in the design process and verification of MMICs. Compact MMICs may disadvantageously suffer from electromagnetic coupling which occurs between various components such as planar waveguides and transistor electrodes. In conventional small signal MESFET layouts, source and drain electrodes are opposite each other, so that the drain electrode is particularly susceptible to undesired coupling. Even modest amounts of parasitic coupling between a nearby microstrip line and a small signal MESFET amplifier may lead to oscillations, degrade circuit balance or distort gain flatness. Workshop J, GaAs MMIC System Insertion and Multifunction Chip Design Issues and Trends, 1991 IEEE MTT-S International Microwave Symposium, Boston, Mass., Jun. 14, 1991. This reference does not teach or discuss the use of a transistor source electrode as a form of on chip shielding. These and other disadvantages of electromagnetic coupling problems are solved or reduced using the present invention.

SUMMARY OF THE INVENTION

An object of the present invention is to reduce unwanted electromagnetic coupling in monolithic microwave integrated circuits (MMICs).

Another object of the present invention is to reduce electromagnetic coupling into field effect transistors in MMICs.

Yet another object of the present invention is to reduce electromagnetic coupling into MESFETs in MMICs.

Still another object of the present invention is to provide a MESFET design having inherent device shielding in order to reduce electromagnetic coupling in MMIC devices.

Still a further object of the present invention is MMIC which are less vulnerable to electromagnetic coupling while remaining compatible with standard planar circuit designs and fabrication processing techniques.

The present invention is a concentric MESFET having an outer disposed source structure which circumscribes inner disposed gate and drain structures. The source design configuration resembles a semi-circle horse-shoe shape for surrounding sensitive drain and gate integrated circuit elements which are susceptible to extraneous electromagnetic coupled noise. The source functions to shield the gate and drain from unwanted electromagnetic noise coupling and cross-talk for improved circuit performance. The concentric MESFET design has been modeled and analyzed for performance verification. The concentric MESFET is particularly useful in microwave monolithic integrated circuits, and has been demonstrated using GaAs semiconductor fabrication process materials. These and other advantages will become more apparent for the following detailed description of the preferred embodiment.

DETAILED DESCRIPTION OF THE PREFERRED EMBODIMENT

Figure 1A:
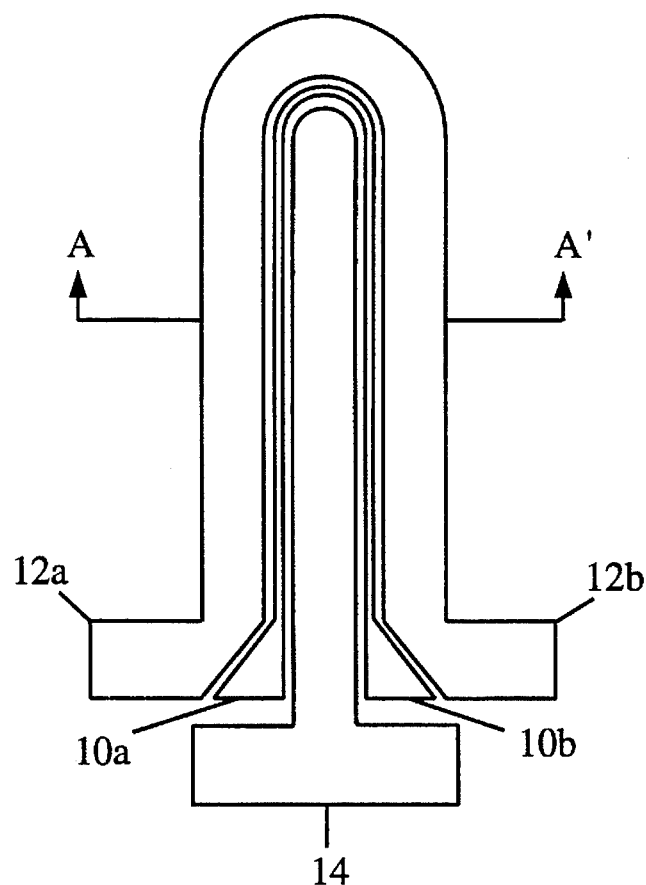
FIG. 1a illustrates a top view of a layout of a Concentric MESFET (CMESFET).
Figure 1B:
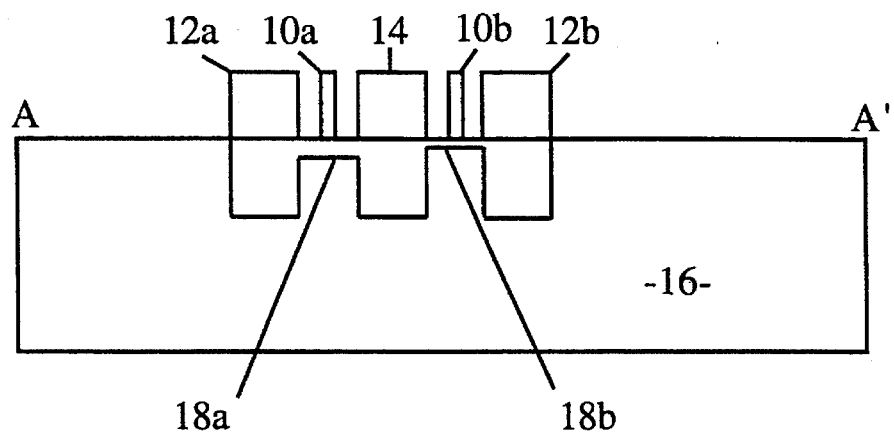
FIG. 1b illustrates an enlarged cross-sectional view of the active region of the CMESFET.

A configuration of a concentric MESFET (CMESFET) suitable for use in hybrid circuits is depicted in FIG. 1a while FIG. 1b shows an enlarged cross-sectional view of an active integrated circuit substrate of the CMESFET. The layouts are not to scale but are intended to show the important features of the design. The CMESFET structure has a gate 10, designated by portions 10a and 10b which terminate in bonding pads as shown. The gate 10 is situated between a source 12, designated by portions 12a and 12b which terminate in bonding pads as shown, and a drain 14 which also terminates with a drain bonding pad as shown. The CMESFET is fabricated on a monolithic microwave substrate 16, shown in FIG. 1b as a side view of reference A–A' in FIG. 1a. The CMESFET has an implanted channel designated as 18a and 18b under the gate portions 10a and 10b, respectively. A well known GaAs process can be used to fabricate the CMESFET with a conventional N' silicon donor dopant to create the implanted channel 18 which may alternately be diffused or epitaxially grown.

The CMESFET has been designed so that the gate 10 and drain 14 are as nearly as practicable entirely surrounded by the grounded source 12 excepting the respective bonding pads, as shown, for external connections. The source 12 which is typically grounded, acts as an electromagnetic shield for the inner gate 10 and drain 14 to isolate the transistor from electromagnetic fields originating in surrounding circuits, not shown. Calculated results have shown how the grounded source 12 of the CMESFET performs a shielding function. The CMESFET is analyzed as a traveling-wave structure to illustrate microwave performance as a function of geometrical and electrical parameters. Interelement capacitances are calculated in order to demonstrate how the geometrical configuration of the CMESFET isolates the drain 14 and gate 10 from unwanted electromagnetic coupling. Interelement capacitances refer to the capacitances between transistor electrodes such as the gate 10 or drain 14 and another circuit elements like a nearby transmission line, not shown.

Figure 2A:
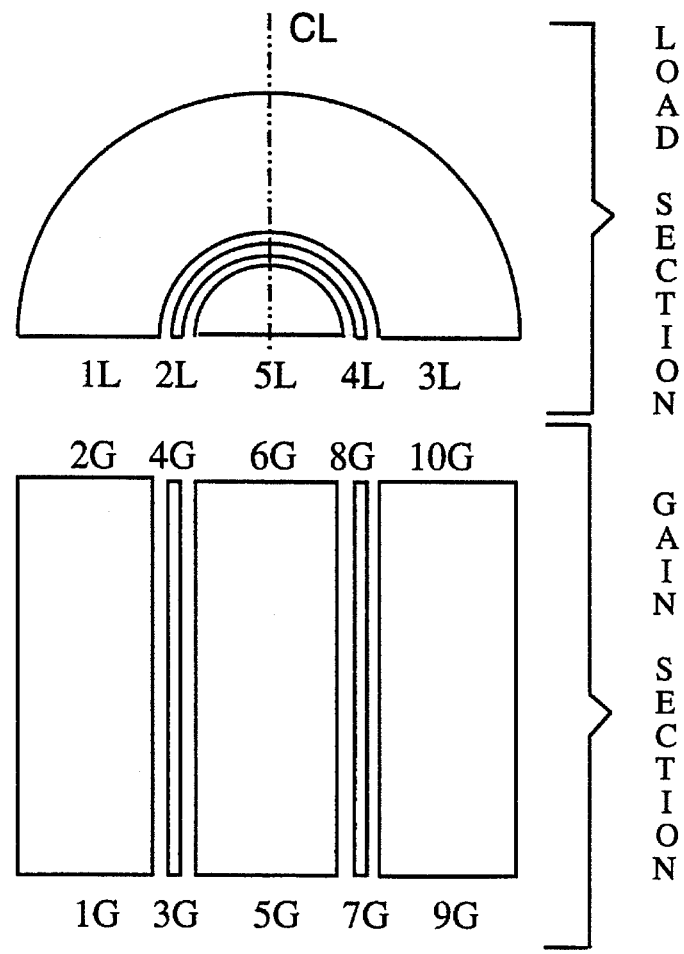
FIG. 2a illustrates the CMESFET separated into its load and gain sections with referenced designated ports.

Previous analyses of traveling-wave transistors have assumed relatively simple terminations. However, because the CMESFET terminates in a 180 degree bend, a different analysis is required and thus the CMESFET transistor is initially split into two parts as shown in FIG. 2a. A first part is a gain section 19a and consists of a longitudinally homogeneous five-electrode section, as shown. A second part is a load section 19b and consists of the curved section at the end of the transistor, as shown. In the gain section 19a, the ends of the left-most source are designated 1G and 2G, those of the left-most gate are designated 3G and 4G, those of the drain are designated 5G and 6G, those of the right-most gate are labeled 7G and 8G, and those of the right-most source are designated 9G and 10G.

Figure 2B:
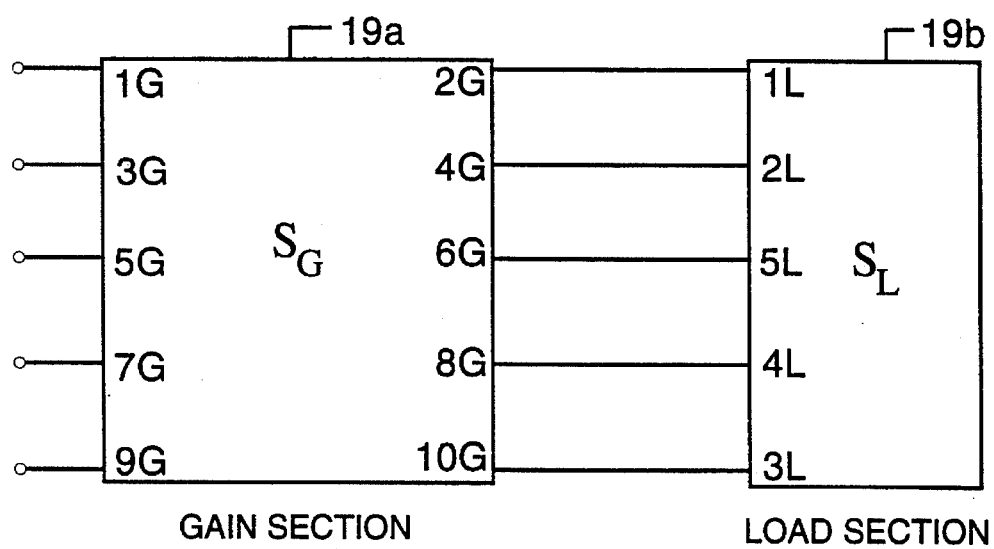
FIG. 2b represents the load and gain sections by five and ten port S-parameter scattering matrices, respectively.

FIG. 2b shows how analysis ports of the two sections 19 are connected. There is a one to one connection between gain ports 2G, 4G, 6G, 8G and 10G of the gain section and respective load ports 1L, 2L, 5L, 4L and 3L of the load section. Each of the ports 2G, 4G, 6G, 8G, 10G, 1L, 2L, 5L, 4L and 3L have an output reflected wave and an input incident wave under standard scattering conventions as is well known. As an example, both port 2G and port 1L both have an output reflected wave and an input incident wave. The other four port connections 4G-2L, 6G-5L, 8G-4L and 10G-3L between the two sections 19a and 19b have similar incident and reflected waves. The connections between the gain ports and load provide for the simulated propagation of output reflected waves and input incident waves. The center line CL of FIG. 2a indicates where the load section 19b is split into two parts for analysis. Lumped elements that model the coupling between the drain 14, the source 12 and gate 10 are placed at this point.

The gain section 19a of FIG. 2a is first 14 analyzed individually using Telegraphist's equations: $[\partial]V/[\partial]z=-[Z]I$; and $[\partial]I/[\partial]z=-[Y]V$. The Telegraphist's equations are used to model wave propagation in the gate 10, drain 14 and source 12. V and I represent complex voltage and current vectors having an $e^{(j\omega t-\gamma z)}$ dependence, where $\gamma$ is the complex propagation coefficient. Each element of V and I corresponds to a complex voltage and current on one of the five electrodes. A sixth electrode, a ground plane, not shown in FIG. 2a or 2b, is assumed to exist on the underside of the dielectric substrate 16 of FIG. 1b.

Figure 3:
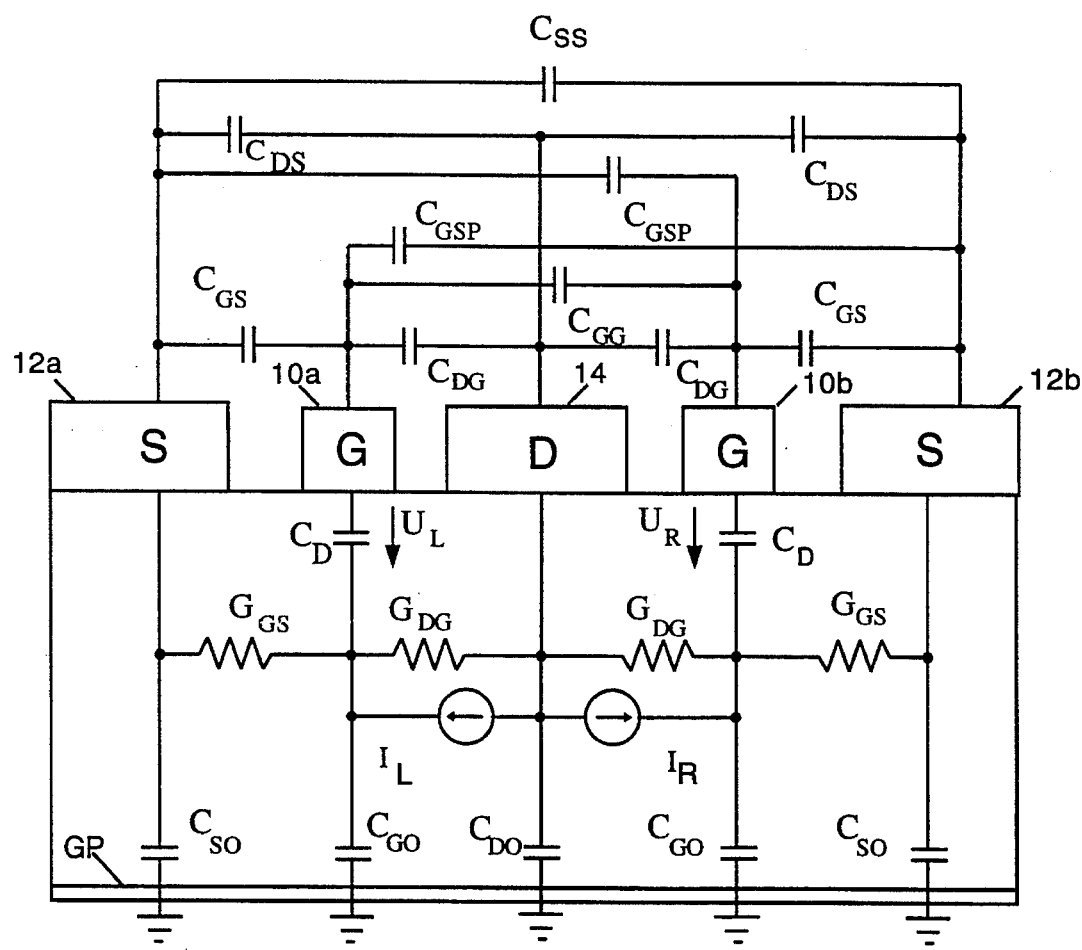
FIG. 3 depicts a model of a circuit used to calculate a 5×5 admittance matrix for the gain section.

A [Y] matrix is found by considering a model of the transistor in the plane perpendicular to the direction of wave propagation as shown in FIG. 3. Referring to FIGS. 1a, 1b and 3, depletion capacitances are modeled by using a simple depletion approximation underneath the gate. $V_R$ and $V_L$ are the voltages across the depletion regions of the implanted channel 18a and 18b on the right and left gate portions 10a and 10b of the transistor, respectively.

Using symmetry, the CMESFET can be treated as having only one source, one gate, and one drain electrode. However, the model used in the present analysis assumes no symmetry and includes all interelectrode capacitances which refers to the capacitances between electrodes 10, 12 and 14 of the transistor, such as the capacitance between the leftmost source and the rightmost gate, $C_{GSP}$ and interelectrode mutual inductances associated with the capacitance $C_{GSP}$. The following interelectrode capacitances per unit length were calculated by solving a Laplace equation in two dimensions using a finite difference method: $C_{SS}$ is the source to source capacitance; $C_{DS}$ is the drain to source capacitance; $C_{GSP}$ is the gate to source prime capacitance, where a gate portion is distal to a source portion 10b and 12a, or 10a and 12b; $C_{GS}$ is the gate to source capacitance, where the gate is proximal to the source; $C_{GG}$ is the gate to gate capacitance; $C_{GO}$ is the gate to ground capacitance; $C_{DO}$ is the drain to ground; $C_{SO}$ is the source to ground capacitances; and $C_{DG}$ is the drain to gate capacitance. Capacitances $C_{DO}$, $C_{SO}$ and $C_{GO}$ are simulated as connected to the ground plane GP of the substrate 16. The value of simulated current generators $I_L$ and $I_R$ are equal to the CMESFET transconductance $G_{ML}$ and $G_{MR}$ multiply to the depletion region value $V_L$ and $V_R$, respectively.

The capacitance per unit length of the Schottky contact, $C_D$ is approximated as a simple depletion capacitance under the gate. A [Z] matrix consists of the metal losses of electrodes 10, 12 and 14, the field inductances per unit length of electrodes 10, 12 and 14, and the shunt conductances per unit length, $G_{GS}$ and $G_{DG}$. Combining Telegraphist's equations yield an eigenvalue equation $([Z][Y]-[\lambda][U])V=0$, where $[\lambda]=[\gamma]^2$ represents the complex eigenvalues and [U] is the identity matrix.

The five eigenvalues and eigenvectors that correspond to five modes of propagation are next solved. The propagation constant $\gamma=\alpha+j\beta=\lambda^{1/2}$ will indicate growing or attenuating waves, depending on the sign of $\alpha$. For the flat gate structure used in all of the present simulations $\alpha>0$, indicating attenuated wave propagation.

The S-parameters of the gain section 19 can be found in several steps. The voltage eigenvectors are substituted back into the second Telegraphist's equation to calculate the current eigenvectors. The current and voltage eigenvectors can be combined to produce the impedance matrix $[Z_{imp}]$, where $Vp=[Z_{imp}]$ Ip. Vp and Ip are the voltages and currents at the ten ports of the gain section as shown in FIG. 2b. The S-parameters are then calculated by using the general S-parameters equation $[S]=[Z_{imp}-Z_{char}]/[Z_{imp}-Z_{char}]$, where $[Z_{char}]$ is the characteristic impedance matrix of fifty ohms along the diagonal of the $[Z_{char}]$ matrix and zero ohms elsewhere.

The S-parameters of the load section 19b are determined next. As seen in FIGS. 2a and 2b, the second part of the transistor consists of a semicircular five port structure that is not longitudinally homogeneous. The semicircular arc of the load section is small compared to both the rest of the CMESFET and the wavelength of the eigenmodes of the gain section 19a. Therefore, the electrical characteristics of the load section 19b are modeled in two parts as shown in FIGS. 4a and 4b.

Figure 4A:
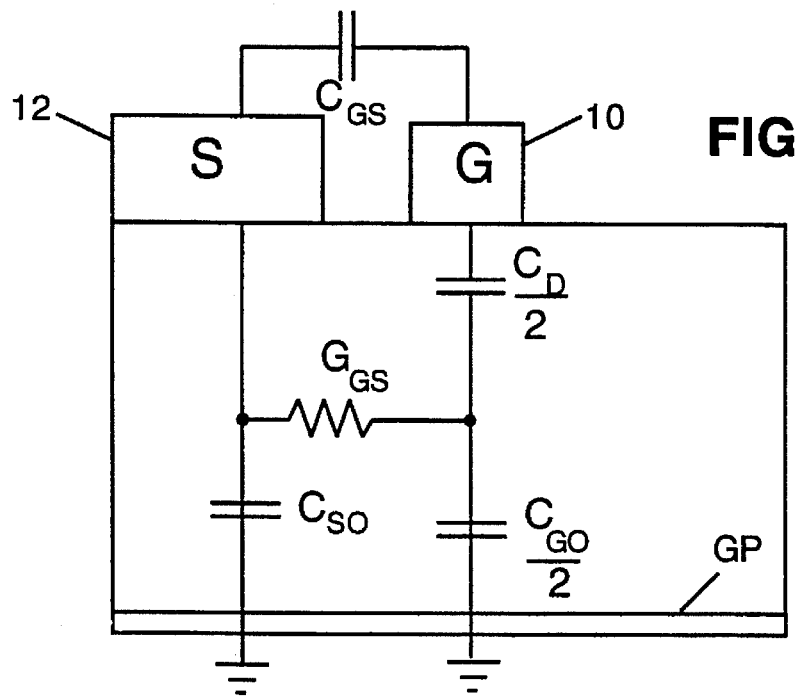
FIG. 4a illustrates a model of a circuit used to calculate a 2×2 admittance matrix for a source coupled and gate coupled transmission line structure that in turn is used to calculate $[Y_{adm}]$.

First 14, referring to FIG. 4a, the source electrode 12 and gate electrode 10 are treated as two coupled transmission lines. From the Telegraphist's equations, [Y] and [Z] matrices are calculated in order to solve the eigenvalue equation for the gate to source coupled transmission line structure of FIG. 4a. FIG. 4a shows the equivalent circuit in the transverse plane needed to calculate the [Y] matrix. The elements in FIG. 4a have the same values as those in FIG. 3. The [Z] matrix is calculated for two transmission lines 20 and 21, or 22 and 23 of FIG. 5a, that is electrodes 10 and 12, of FIG. 4a. A procedure similar to that used to calculate $[Z_{imp}]$ is used to calculate two $[Y_{adm}]$ matrices, 30 and 32 which are a length scaled inverse of $[Z_{imp}]$, for parts 24 or 25 of the load section 19b shown in FIG. 5a. Matrices $[Y_{adm}]$ 30 and 32 are both a four-port admittance matrix for the coupled transmission lines 20 and 21 and 22 and 23, respectively.

Figure 4B:
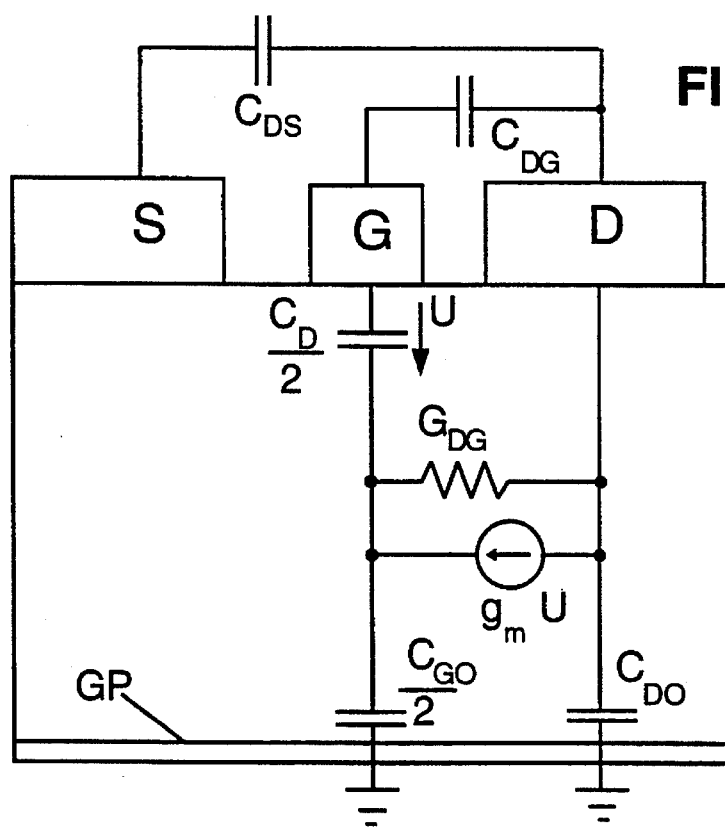
FIG. 4b illustrates a model of a circuit used to calculate $[Y_{lump}]$, which describes source to drain and gate to drain coupling.

Secondly, referring to FIG. 4b, all coupling to a semicircular drain portion 34 from the source 21 or 23 or gate 20 or 22 transmission lines is modeled by using lumped elements that are placed at the center line CL of the semicircular arc of parts 24 and 25. The elements 24 and 34 or 25 and 34 are modeled as shown in FIG. 4b. An admittance matrix, $[Y_{lump}]$ 36 is calculated for the circuit comprising part 34 and its connection to parts 24 and 25.

Figure 5A:
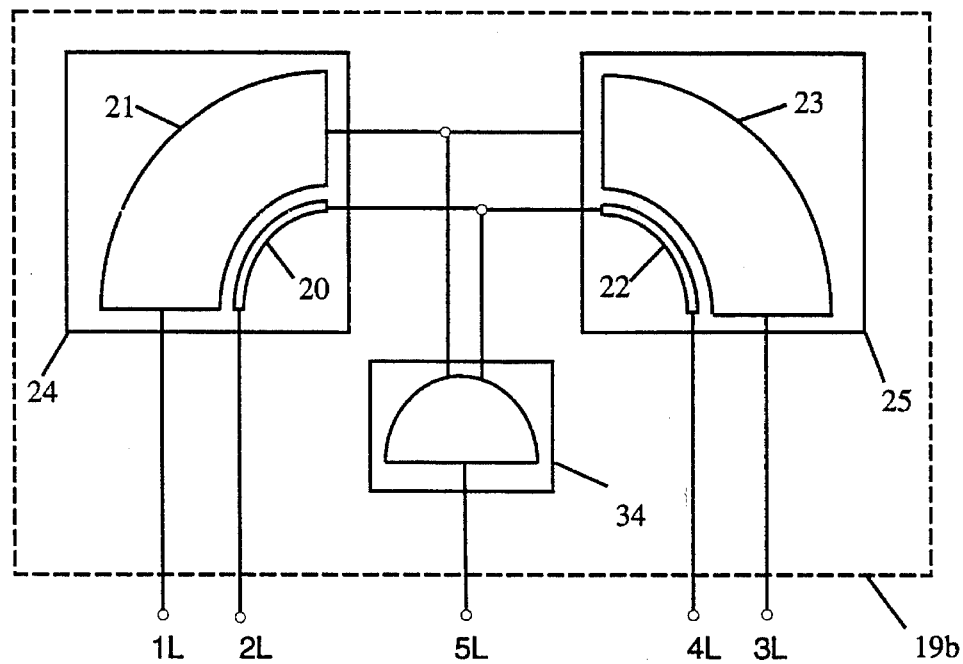
FIG. 5a illustrates interconnections between structural geometries of the load section.
Figure 5B:
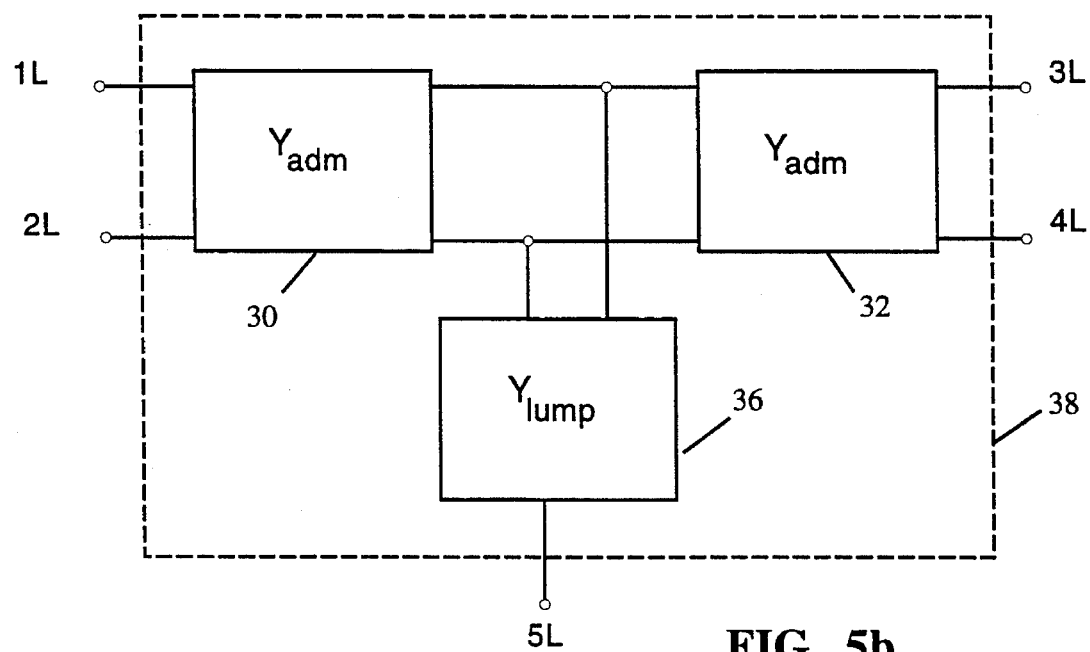
FIG. 5b illustrates modeling interconnections between various admittance matrices describing an electrical operation of the load section.

The relationships between the admittance matrices 30, 32 and 36 and the arc geometry portions 24, 25 and 34 are shown in FIG. 5a and 5b. The point at which matrix $[Y_{lumb}]$ 36 connects to the two $[Y_{adm}]$ matrices 30 and 32 are located on the center line CL of the load section 19b referenced in FIG. 2a. A five-port admittance matrix 38 calculated from the combination of the three admittance matrices 30, 32 and 36 is used to calculate the S-parameters of the load section 19b. The three admittance matrices 30, 32 and 36 are combined to form the composite five-port admittance matrix 38, as shown in FIG. 5b. The port labels of the composite admittance matrix 38, e.g. 1L, correspond to the same port labels of the load section 19b in FIGS. 2a and 5a. The S-parameters of the five-ports can be calculated by using the dual of the S-parameters equation. The S-parameters of the semicircular arc describe the load seen by the gain section 19a of the CMESFET. Therefore, the CMESFET acts much like a traveling-wave reflection amplifier. The source ports 1G and 9G are grounded. Port 5G is connected to a 50 ohm load. Ports 3G and 7G receive the input incident waves. All the outgoing reflective waves of ports 16, 3G, 5G, 7G and 9G of gain section 19a referenced in FIG. 2b can be solved.

Figure 6A:
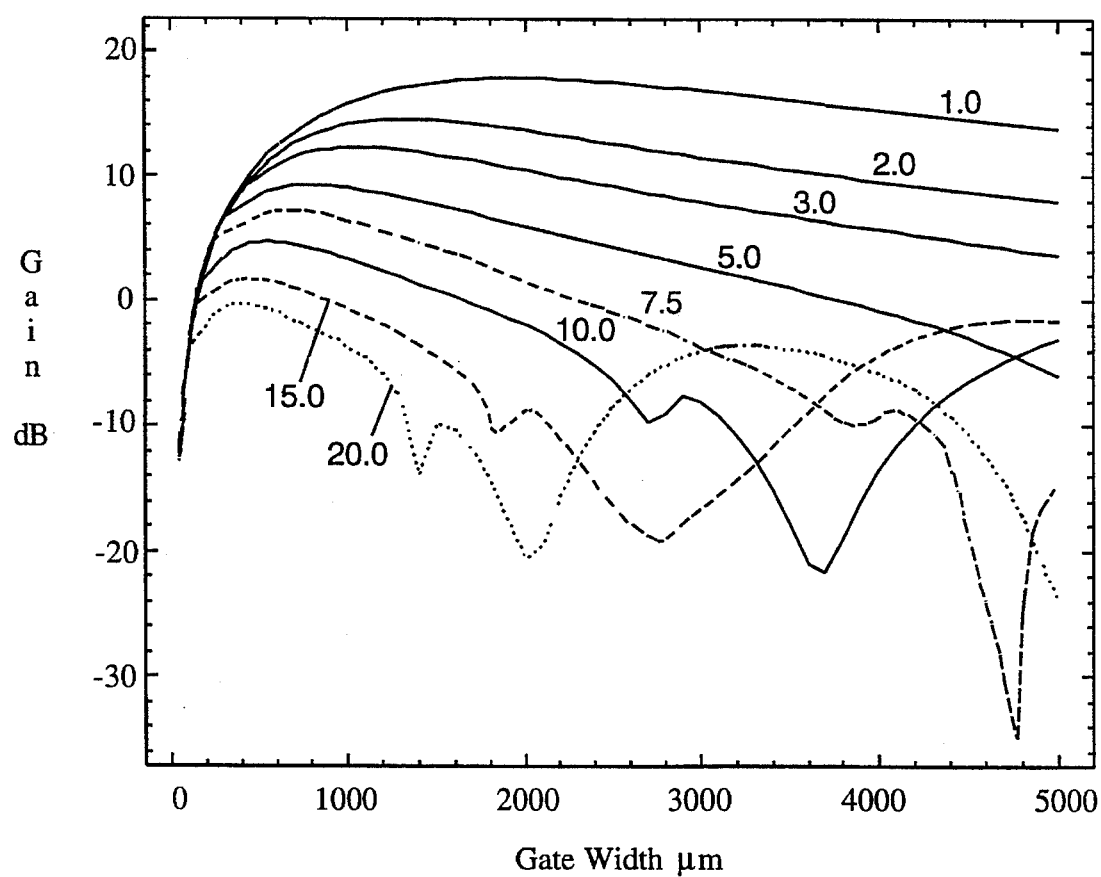
FIG. 6a is a graph plotting simulated gain curves versus gate width for different operating frequencies of a CMESFET having a gate length of 2 μm.

Simulation of CMESFET performance as been produced. FIG. 6a shows a plot of gain versus the gate width for several frequencies. Resonance valleys are typical of the gain characteristics of traveling-wave transistors whose gate widths are large compared to their eigenmode wavelengths.

All CMESFETs analyzed had the following nominal material and electrical parameters: a metal thickness of 1.0 μm, a metal conductivity of $3.8 \times 10^7$ S/m, an implanted channel depth of 0.1 μm having a doping of $N_d = 1.1 \times 10^{17}$/cm$^3$, an electron mobility of 4000 cm$^2$(V-s), a gate-drain resistivity of 0.12 ohm-m, a GaAs substrate of relative dielectric permitivity $\epsilon_r = 12.9$, and a nominal $g_m = 100$ mS/mm. In order to keep the traveling-wave transistor compact, the source to source separation was set to 10 μm. The left and right portion 10a and 10b of the gate 10 were driven with inputs of equal phase and amplitude. This driving condition is known as the common-mode or balanced-input configuration. The CMESFET yielding the behavior shown in FIGS. 6a, 6b and 6c have a 2 μm long gate 10 which was centered between the drain 14 and the source 12.

Figure 6B:
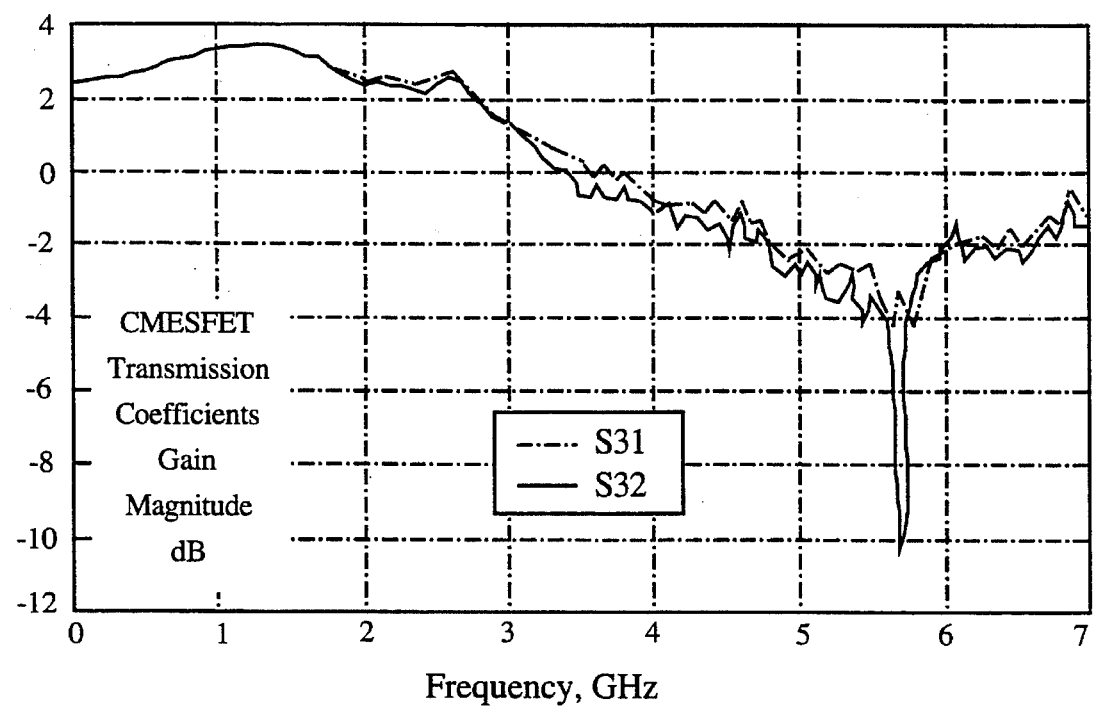
FIG. 6b is a graph plotting measured gain versus operating frequencies up to 7 GHz of a CMESFET with a 2 μm gate length, with a drain bias of 3.2 V and a gate bias of 0–0.1 v, for transmission scattering parameters S31 and S32.

Simulations show that the 2 μm device exhibits gain over a relatively wide range of gate widths and frequencies. For example, in the 0.5 to 20.0 GHz frequency range, maximum gains are achieved with devices that have gate widths between 0.3 and 3.0 mm. FIG. 6b shows the transmission coefficient gain performance of a fabricated CMESFET measured with a microwave network analyzer up to a frequency of 7 GHz. The nominal material and electrical parameters of the fabricated device were similar to those stated above.

Figure 6C:
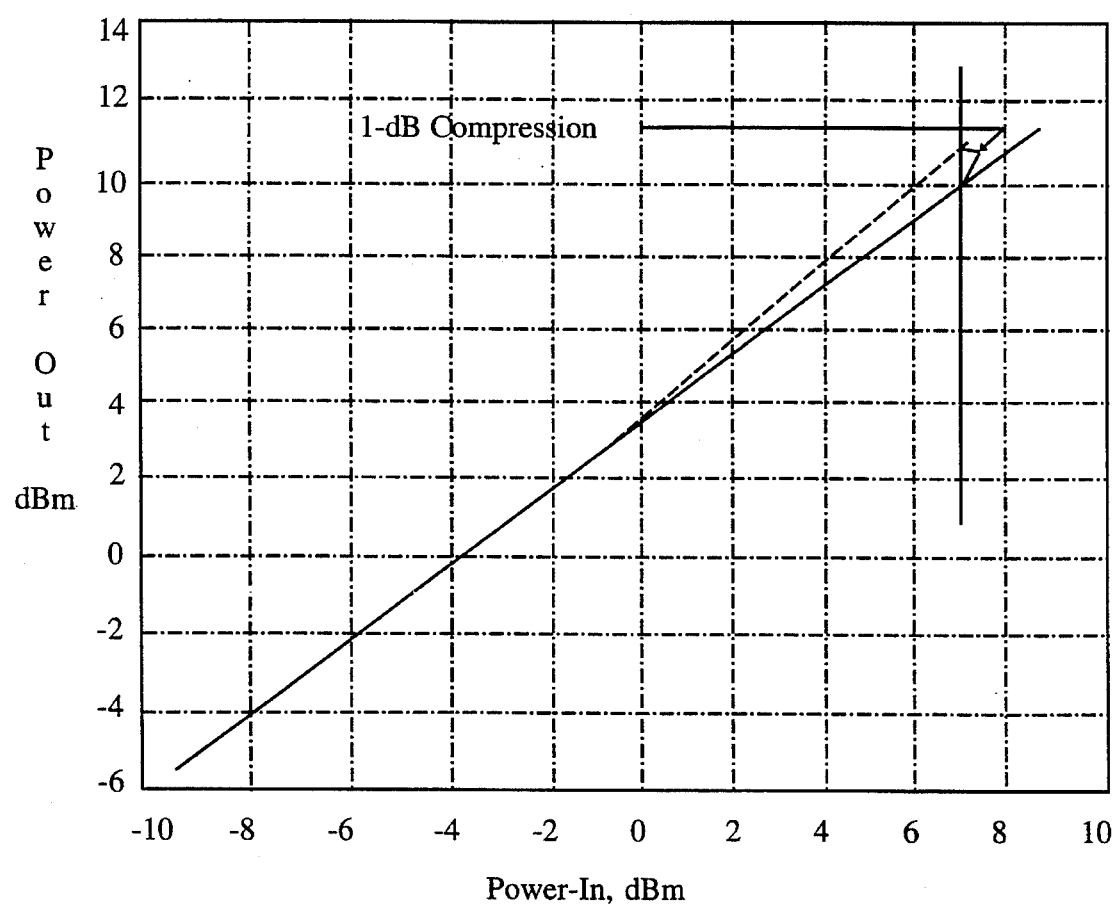
FIG. 6c is a graph plotting measured 1 dB gain compression at 10 dBm output power for the CMESFET.

FIG. 6c shows the measured 1 dB gain compression point at approximately 10 dBm output power for the measured device. The behavior of deviation from gain linearity for the CMESFET is consistent with expectations for a small-signal device. The measured performance of the CMESFET in a microwave mixer with a Local Oscillator and RF input frequencies of approximately 2 GHz, yielded 6.3 dB conversion loss which is not unusual for a device of the given aforementioned dimensions and characteristics. This measured behavior indicates that the CMESFET exhibits suitable transistor performance.

A model of interelement capacitances and coupling is used to predict device performance. The geometry of the CMESFET employs the source metal of the transistor as a horse-shoe shaped ring that shields the gate and drain electrodes. In order to calculate interelement capacitive coupling between extraneous circuits and the CMESFET, a three-dimensional Laplace equation is solved. Static capacitances have been used as first-order approximations to model nearby interelement coupling through a finite difference method program.

Figure 7A:
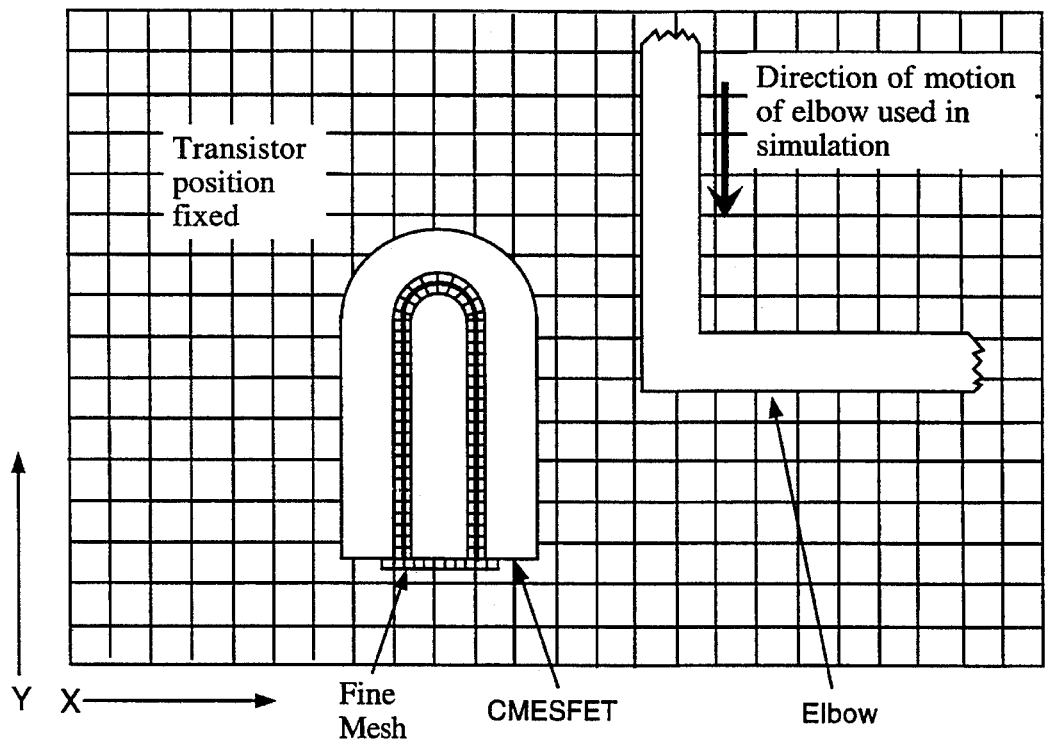
FIG. 7a is a top view of a geometrical layout of the CMESFET and a transmission line elbow.
Figure 7B:
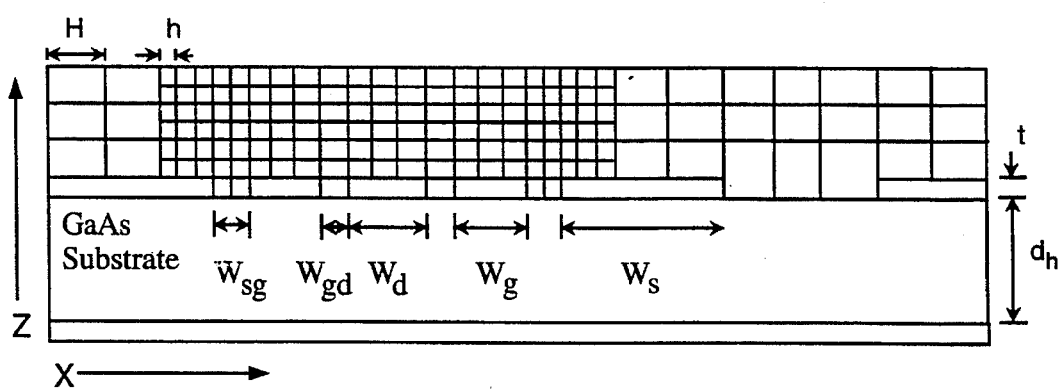
FIG. 7b is a cross-sectional view of a GaAs substrate supporting the CMESFET and the transmission line elbow.

FIG. 7a and 7b show the arrangement of the electrodes and a mesh employed in the simulations. The coupling capacitance calculations used the following nominal geometries: the gate to source separation, gate to drain separation, gate length, and metal thickness were all 1 μm; the substrate was GaAs with $\epsilon_r = 12.9$; the drain width was 4 μm; and the gate width was 40 μm. The extraneous circuit from which coupling occurs is an elbow-shaped piece of transmission line representative of a possible layout in an MMIC. The ends of the arms of the elbow were kept as far as possible from the transistor's electrodes in order to minimize fringing effects. All transistors electrodes and the elbow were placed at the same height on the substrate, and the mesh peripheral boundaries were set far enough away so as not to affect the calculated results. A fine mesh, although hard to see in the top view of 7a, is clearly shown in the cross-sectional view of FIG. 7b. The course and fine meshes as shown are not to scale. A nominal ratio H:h is 8:1, with h=0.25 μm. The distance between the source and gate $W_{sg}$, the gate and drain $W_{gd}$, as well as the width of the source $W_s$, the width of the gate $W_g$, and the width of the drain $W_d$, are shown. The height of the substrate $d_h$ and the metal thickness t are also shown. The course and fine meshes extend into the substrate, but are not shown.

A fine mesh with closely spaced points is placed around the immediate vicinity of the CMESFET electrodes to model accurately the small, approximately 1 μm, geometries of the electrodes. Beyond the immediate area of the gate to source spacing, as shown in FIG. 7b, a fine mesh resolution is not required. A coarser mesh is placed outside of and adjoining the finer mesh. The elbow to transistor separation was 10 μm in one direction and was variable in the other direction. For example, in FIG. 7a the distance in an X direction between the source and elbow is 10 μm. The elbow is placed at different positions in the Y direction.

Simulation of interelement capacitances and coupling is used to characterized device performance. To investigate the effectiveness of the source geometry in decoupling the gate and drain from an external extraneous transmission line, the elbow is initially placed far from the CMESFET. The electrostatic induction coefficients are calculated for the four pieces of metal, that is, the three transistor electrodes and the one extraneous transmission-line elbow as the elbow changes position. The elbow is moved relative to the transistor and the coefficients are recalculated for each new position. Interelement capacitances, that is, those between the transistor electrodes and the nearby elbow transmission line, were computed for the CMESFET and compared to those for the conventional MESFET layout as shown in FIG. 8a and 8b.

In order to make a meaningful comparison of the shielding capability of both layouts, the gate widths, gate lengths, and drain to gate and gate to source separations for each FET geometry were the same. The overall area of each configuration was kept approximately the same. The bond pads for the gate, source, and drain of both the conventional MESFET and the CMESFET were not included in the capacitance coupling simulations. To verify that the pertinent dimensions of the two layouts were indeed equivalent, the drain to gate and gate to source capacitances of each topology were examined. The agreement between these corresponding interelectrode capacitances of each geometry was excellent. This agreement demonstrates that the device geometries, as far as interelectrode capacitances are concerned, are equivalent.

Figure 9:
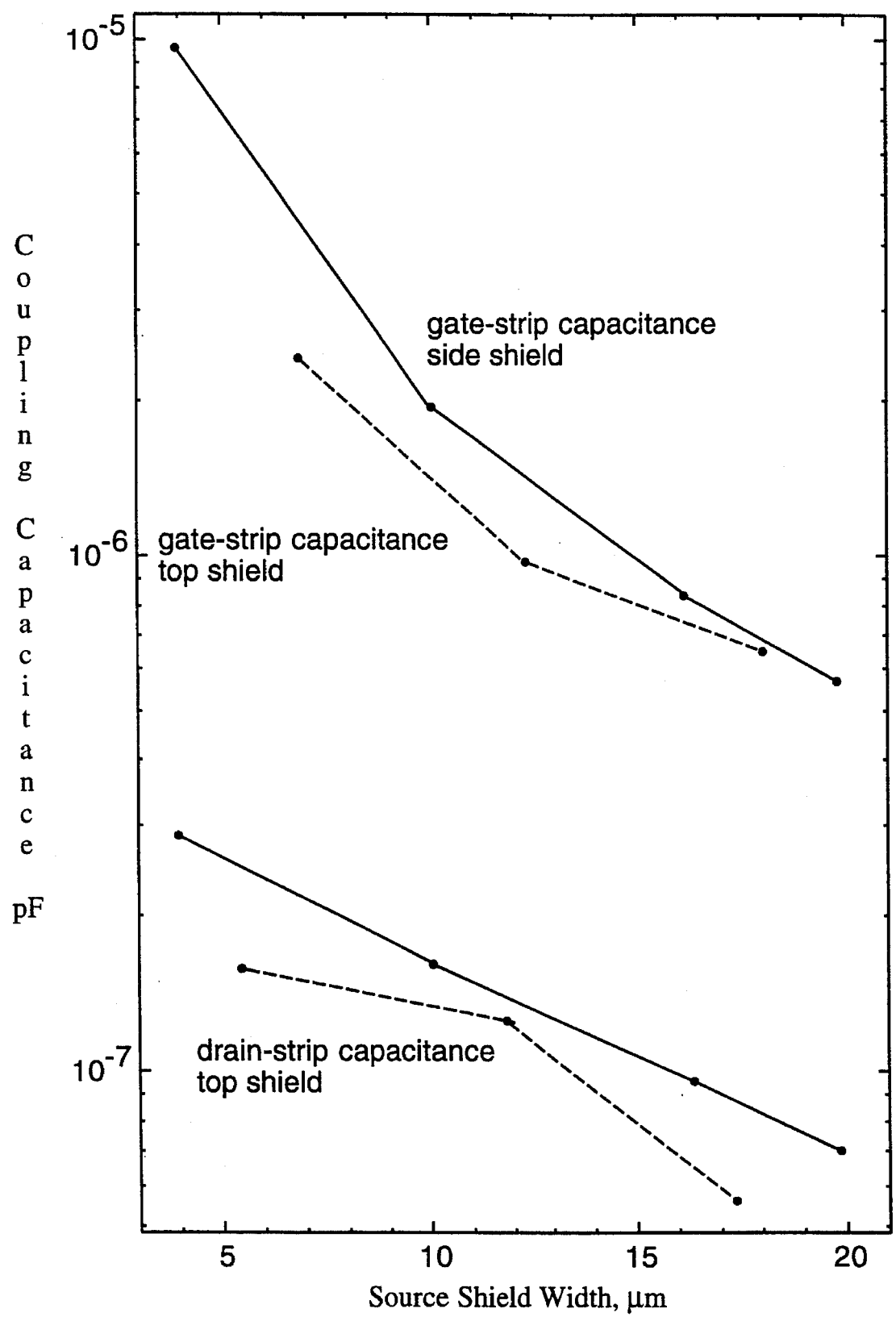
FIG. 9 is a graph plotting capacitive coupling between the gate and drain of the CMESFET and the transmission line elbow for differing source shield widths.

FIG. 9 shows the effect of shield width on gate to elbow and drain to elbow interelement coupling capacitance for two different elbow orientations. First, the elbow is placed 10 μm from in the X direction and parallel to the long dimension of the CMESFET. The elbow is then moved to different Y coordinates. The solid lines of FIG. 9 reflect the results. The dashed lines show the effect of shield width on the same interelectrode coupling when the elbow is placed on a constant Y coordinate 10 μm from the top of the CMESFET bend and is moved to different X coordinates. Clearly, a shield width of even 10 μm between the electrodes and the elbow significantly reduces the gate to elbow coupling. Drain to elbow coupling is also reduced, though not as much. This additional isolation will increase device immunity to crosstalk and thus improve circuit performance. Tradeoffs may be made between shielding, source widths and smaller-area transistors.

Figure 8A:
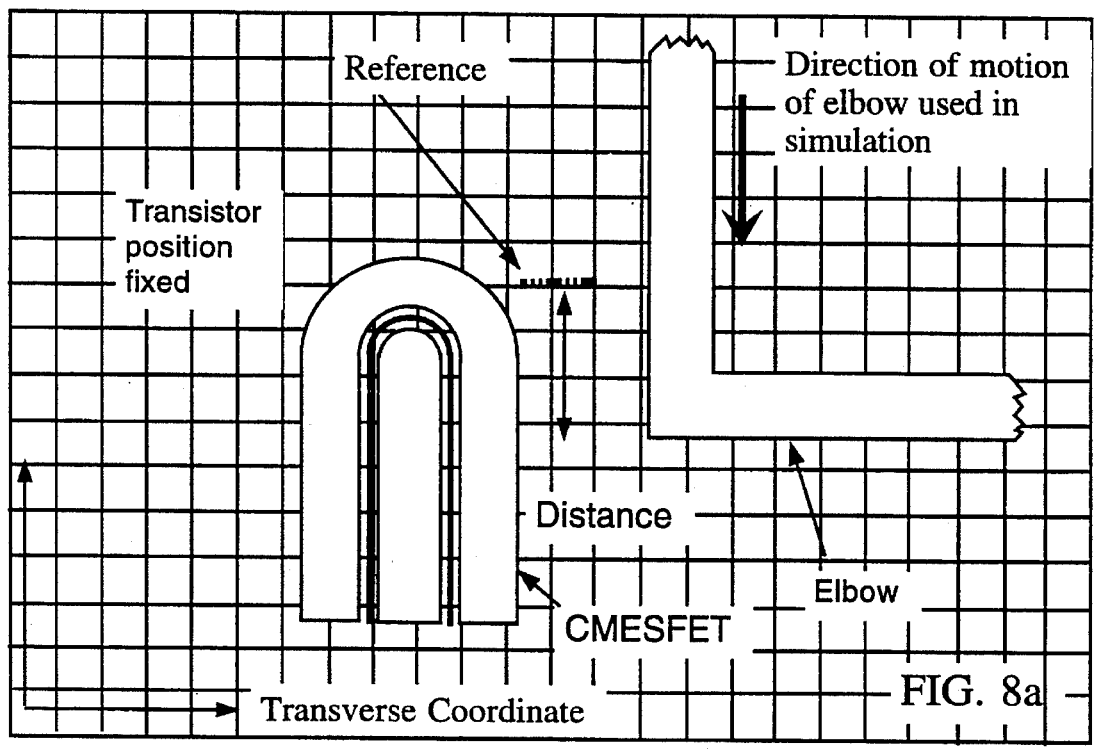
FIG. 8a shows the layout of CMESFET with parallel and transverse coordinates.
Figure 8B:
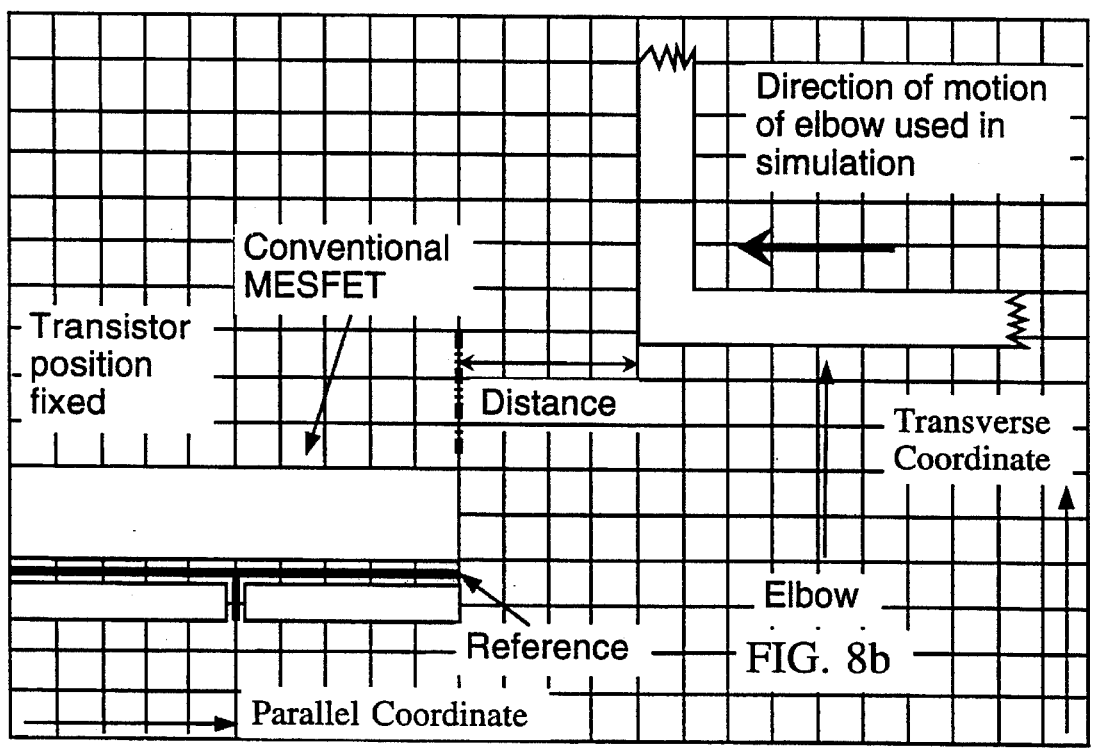
FIG. 8b shows the layout of conventional MESFET with parallel and transverse coordinates.

FIGS. 8a and 8b show the geometrical system, composed parallel and transverse coordinates, used to calculate and then compare the interelectrode coupling capacitances of both the CMESFET as in FIG. 8a, and a conventional MESFET as in FIG. 8b. With the transverse coordinate held constant, the long dimension of the gate, that is, the gate width, is parallel to the axis of the parallel coordinate in the system. Correspondingly, with the parallel coordinate held constant, a line on this transverse coordinate is parallel to the short dimension of the gate, that is the gate length. The Reference indicates the point from which distances were measured for each elbow position. The Distance is defined as the distance between the Reference and the corresponding edge of the elbow.

Figure 10:
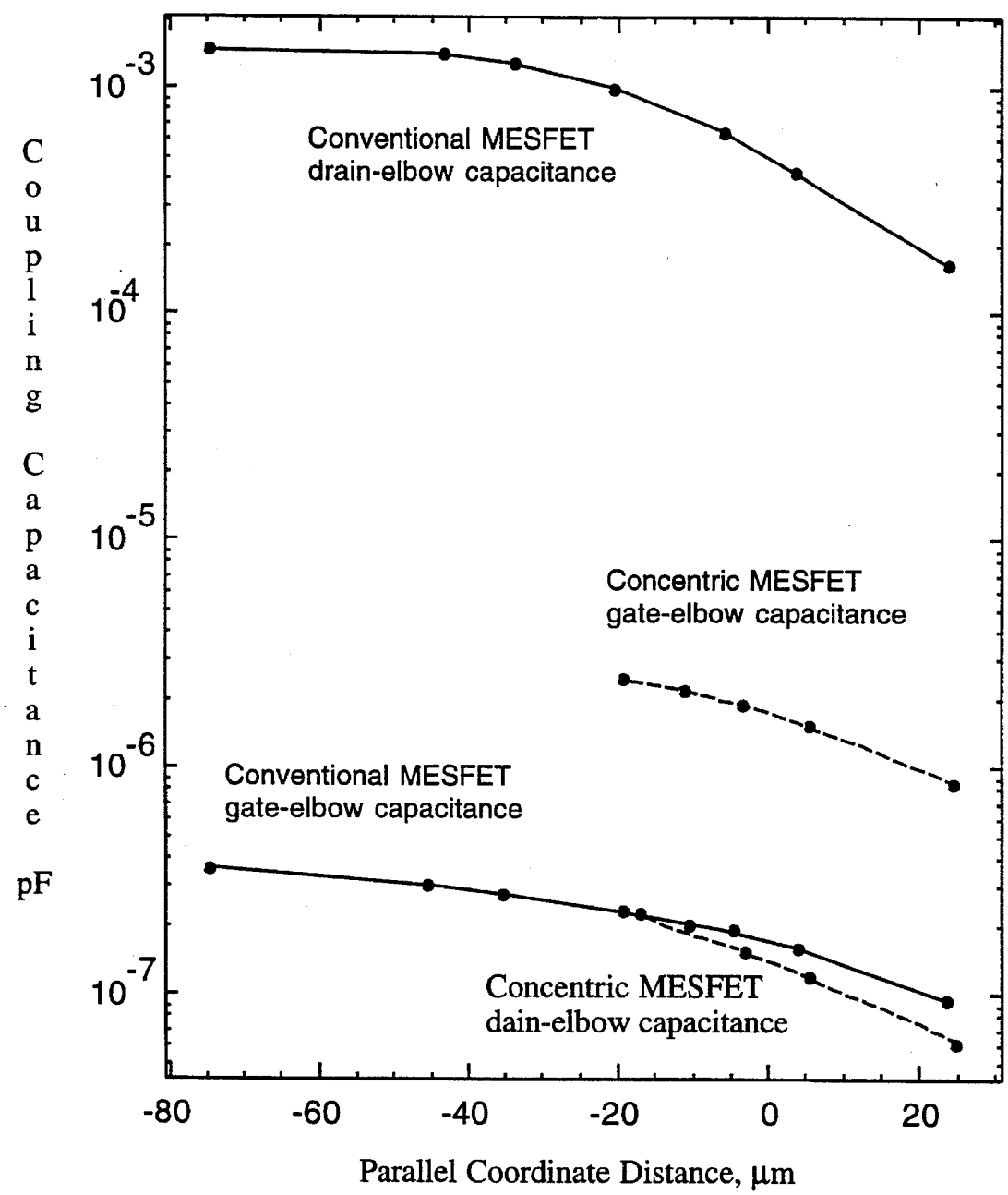
FIG. 10 is a graph plotting comparisons of gate to elbow strip and drain to elbow strip capacitances of the CMESFET and the conventional MESFET.

Calculated results are shown in FIG. 10 and indicate the coupling between the gate or drain of the device and the nearby elbow. A positive distance means that there is no overlap between the elbow and the gate. Consequently, a negative distance means that the gate and elbow overlap. The CMESFET has a source shield width of 10 μm in all cases. The drain of the CMESFET is least vulnerable to effects caused by the elbow, as indicated by low coupling capacitance values. The drain of the conventional MESFET is the most exposed transistor electrode in a MMIC and is most vulnerable, with drain to elbow capacitances more than three orders of magnitude greater than those of the CMESFET. This is not surprising because the drain of the CMESFET is the innermost electrode of the device. The shielding of the drain by the geometry of the CMESFET allows other elements to be placed relatively close to the transistor, which in turn produces a more compact circuit. With a compact configuration, a CMESFET could be accommodated in roughly 80% of the area required by a conventional linear configuration of the same gate width.

Although the conventional MESFET exhibits smaller gate to elbow coupling capacitance, the values for that parameter in the two configurations are within only an order of magnitude of each other, indicating that the CMESFET performs satisfactorily. However, an increased source width on the CMESFET would further decrease both gate to elbow and drain to elbow capacitances. This increased shielding would reduce the apparent small advantage in gate to elbow coupling exhibited by the conventional MESFET, while further enhancing the drain to elbow coupling advantage exhibited by the CMESFET. Even though this extra shielding increases the area required by the CMESFET, the basic CMESFET topology is more compact than that of the conventional MESFET for identical gate widths. Accommodating a slightly wider source width could be arranged so that the CMESFET would contribute no more to the total surface area of the MMIC chip than would a conventional MESFET, and do so while maintaining the advantage of enhanced crosstalk immunity.

With two contact pads for the gate electrode, the CMESFET could lend itself to applications other than simple, compact small-signal amplifiers. The CMESFET could be used as a phase detector. The magnitude of the output signal on the drain would be a function of the phase difference of the signals applied to each gate contact pads. The frequency response of the CMESFET could be used as a filter to eliminate undesired signals. For example, consider a mixer circuit whose RF and Local Oscillator frequencies were near 7.5 GHz. As shown in FIG. 6a, this is a frequency at which high rejection could be achieved with a device having a gate width of 4.7 mm. With a CMESFET employed as an IF amplifier following this mixer, up to 34 dB of rejection for any RF or Local Oscillator feed through from the mixer could be achieved. The CMESFET could also be employed as a dual-port mixer, with a different input frequency at each gate contact pad.

The CMESFET uses a configuration that reduces the vulnerability of the transistor to undesired coupling and crosstalk, providing improved shielding in increasingly crowded microwave circuits. Simulations indicate that the CMESFET, with a gate having a length of 2 μm, can act as a small-signal amplifier having usable gain up to approximately 17 GHz, depending upon gate width. Simulation of the interelement coupling capacitances between the transistor and a nearby elbow show a rapid decrease in the coupling capacitance as the width of the shielding source electrode is increased. These results show that the shielding source electrode is valuable in isolating the device. A concentric horse-shoe shape configuration of the CMESFET requires a smaller area than the conventional layout for a given device width. The dual contact pad gate input structure could enable the CMESFET to act as a phase detector and a transistor mixer.

Although the invention has been described in terms of a preferred embodiment, it will be obvious to those skilled in the art that alterations and modifications may be made without departing from the invention. Accordingly, it is intended that all such alterations and modifications be included within the spirit and scope of the invention as defined by the appended claims.

What is claimed is:

1. A concentric FET on and within a semiconductor substrate having a plurality of semiconductor circuits generating electromagnetic radiation in proximity to said concentric FET, said concentric FET connected to a ground signal, a power signal and a control signal, said concentric FET comprising, a gate electrode of conducting metal having at least one gate contact pad connected to said control signal, said gate electrode positioned over a channel portion on said semiconductor substrate, said gate electrode for controlling electron flow through said channel portion, said gate electrode has a semicircle portion with a first straight portion and a second straight portion both extending from said semicircle portion, a drain electrode of conducting metal having at least one drain contact connected to said power signal, said drain electrode positioned over a drain portion on said semiconductor substrate, said drain portion abutting said channel portion for draining said electron flow from said channel portion, said drain electrode has a semicircle portion with a straight portion extending from said semicircle portion, a source electrode of conducting metal having at least one source contact connected to said ground signal, said gate electrode position over a source portion on said semiconductor substrate, said source electrode has a semicircle portion with a first straight portion and a second straight portion both extending from said semicircle portion, said source portion abutting said channel portion for sourcing said electron flow to said channel portion, said source electrode concentrically surrounding said gate electrode which is concentrically surrounding said drain electrode, said source electrode shielding said gate electrode and said drain electrode from said electromagnetic radiation, wherein said drain electrode has a drain contact pad at an end of said straight portion of said drain, and said source electrode has two source contact pads at respective ends of said first and second straight portions of said source electrode, and said gate electrode has two gate contact pads at respective ends of said first and second straight portions of said gate electrode.

2. The concentric FET of claim 1 wherein said source electrode, and said drain electrode and said gate electrode have a metal thickness of 1.0 µm with a metal conductivity of $3.8 \times 10^7$ S/m.

3. The concentric FET of claim 1 wherein said semiconductor substrate is GaAs, said channel portion has an implanted channel depth of 0.1 µm having a doping of $N_d = 1.1 \; 10^{17}/cm^3$, and said gate electrode has a gate length of 2 µm and a gate width of 3 mm.

4. The concentric FET of claim 1 wherein said electron flow through said channel portion has an electron mobility of 4000 $cm^2/(V\text{-}s)$.

5. The concentric FET of claim 1 where said gate electrode and said drain electrode have a resistivity of 0.12 ohm-m therebetween.

6. The concentric FET of claim 1 wherein said semiconductor substrate is a GaAs substrate with an $\epsilon_r$ equal to 12.9 and said concentric FET has a transconductance of 100 mS/mm.

* * * * *